United States Patent
Matsunobu et al.

(10) Patent No.: US 7,820,531 B2
(45) Date of Patent: Oct. 26, 2010

(54) METHOD OF MANUFACTURING SEMICONDUCTOR DEVICE, METHOD OF MANUFACTURING DISPLAY APPARATUS, APPARATUS OF MANUFACTURING SEMICONDUCTOR DEVICE, AND DISPLAY APPARATUS

(75) Inventors: Goh Matsunobu, Kanagawa (JP); Koichi Tatsuki, Kanagawa (JP); Yoshio Inagaki, Kanagawa (JP); Nobuhiko Umezu, Kanagawa (JP); Koichi Tsukihara, Kanagawa (JP)

(73) Assignee: Sony Corporation, Tokyo (JP)

( * ) Notice: Subject to any disclaimer, the term of this patent is extended or adjusted under 35 U.S.C. 154(b) by 101 days.

(21) Appl. No.: 12/247,370

(22) Filed: Oct. 8, 2008

(65) Prior Publication Data
US 2009/0095962 A1    Apr. 16, 2009

(30) Foreign Application Priority Data
Oct. 15, 2007   (JP)   ............................. 2007-268347

(51) Int. Cl.
*H01L 21/20* (2006.01)
*H01L 21/36* (2006.01)

(52) U.S. Cl. .................... 438/487; 438/486; 438/16; 438/166; 438/795; 257/E21.134; 257/E21.347; 257/E21.475

(58) Field of Classification Search ................ 438/487, 438/486, 16, 166, 795; 257/E21.134, E21.347, 257/E21.475
See application file for complete search history.

(56) References Cited

U.S. PATENT DOCUMENTS

2003/0017658 A1 *  1/2003  Nishitani et al. ............ 438/149
2005/0214959 A1 *  9/2005  Hatano et al. ................. 438/16

FOREIGN PATENT DOCUMENTS

JP        2006-032928         2/2006

* cited by examiner

*Primary Examiner*—Thanh V Pham
*Assistant Examiner*—Maria Ligai
(74) *Attorney, Agent, or Firm*—Sonnenschein Nath & Rosenthal LLP

(57) ABSTRACT

A method of manufacturing a semiconductor device includes the steps of: modifying a semiconductor film by applying a laser beam; and forming a semiconductor device on the modified semiconductor film. In the step of modifying the semiconductor film, the laser beam and the substrate are moved relative to each other in a first direction and a second direction which is opposite to the first direction, a change in an optical characteristic between an area irradiated with the laser beam and an area which is not irradiated with the laser beam in the substrate or an optical characteristic of the irradiated area is measured in each of the first and second directions, and irradiation power of the laser beam is modulated so that the difference between a measurement result in the first direction and a measurement result in the second direction lies in a predetermined range.

9 Claims, 16 Drawing Sheets

STAGE SPEED

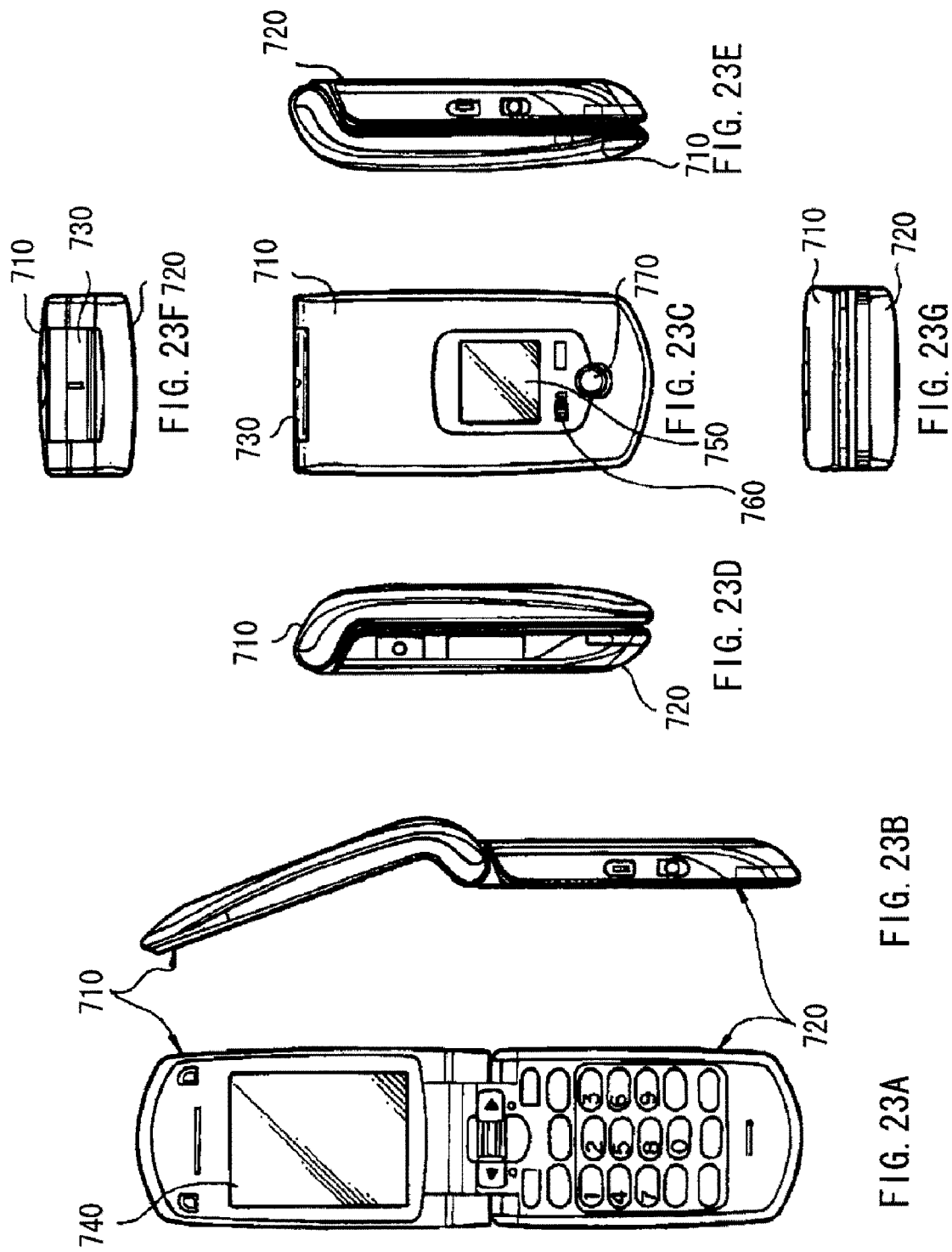

US 7,820,531 B2

METHOD OF MANUFACTURING SEMICONDUCTOR DEVICE, METHOD OF MANUFACTURING DISPLAY APPARATUS, APPARATUS OF MANUFACTURING SEMICONDUCTOR DEVICE, AND DISPLAY APPARATUS

CROSS REFERENCE TO RELATED APPLICATIONS

The present invention contains subject matter related to Japanese Patent Application JP 2007-268347 filed in the Japanese Patent Office on Oct. 15, 2007, the entire contents of which being incorporated herein by reference.

BACKGROUND OF THE INVENTION

1. Field of the Invention

The present invention relates to a method of manufacturing a semiconductor device suitable for manufacture of a TFT (Thin Film Transistor) used in, for example, a liquid crystal display or an organic light emitting display, a method of manufacturing a display apparatus, an apparatus of manufacturing a semiconductor device, and a display apparatus.

2. Description of the Related Art

A TFT substrate is used in an active matrix liquid crystal display or an organic light emitting display. The TFT substrate is obtained by forming a semiconductor film which is amorphous or of polycrystal having a relatively small grain diameter on a substrate, performing an annealing operation by irradiating the semiconductor film with a laser beam, and forming a TFT as a drive element. In some cases, the semiconductor film is directly irradiated with a laser beam. There is also a case that a light absorption layer is formed over the semiconductor film and a laser beam is indirectly applied to the semiconductor film from the light absorption layer side.

To realize higher throughput of a laser annealing apparatus, it is desirable to use a linear beam. In particular, a laser diode has high output stability and the cost is low, so that a large-grain-size semiconductor film is formed stably. Therefore, by using the laser diode as the light source of the laser annealing apparatus, a TFT with high mobility and little variations is able to be realized at low cost.

However, in the case of using a laser diode, since the size of a beam spot is very small, scan time per unit area increases, productivity deteriorates, and manufacturing cost increases. Therefore, to realize higher throughput of annealing, a method of making a laser beam reciprocate or a method of disposing a plurality of lasers close to each other in order to irradiate a large area and simultaneously irradiating a plurality of parts in an amorphous semiconductor film with a plurality of laser beams is employed. By the method, the scan time is shortened, and productivity is increased.

SUMMARY OF THE INVENTION

However, in the case of making a laser beam reciprocate, if the beam profile in a forward path and that in a backward path are not the same, a difference occurs between crystallinity in the forward path and that in the backward path, and a TFT characteristic difference occurs according to an annealing direction. Moreover, there is the possibility that the TFT characteristic difference is visually recognized as display unevenness in a display apparatus.

Even if the beam profiles in the forward and backward paths are shaped symmetrically, if an irradiation optical system tilts with respect to an object to be irradiated, the incident angle of a laser beam in the forward path and that in the backward path become different from each other. As a result, the beam profiles become asymmetric, and it also causes a TFT characteristic difference according to the annealing direction.

The irradiation optical system may tilt accidentally due to an installation error of the optical system. There is also a case where the irradiation optical system is intentionally tilted in order to prevent return light from an object to be irradiated or to prevent occurrence of an interference fringe (for example, refer to Japanese Unexamined Patent Application Publication No. 2006-32928). In each case, the irradiation parameters vary between the forward path and the backward path in such a state. It causes display unevenness in a display apparatus completed.

To address the issue, there is a method of adjusting the tilt angle in the forward path and the tilt angle in the backward path to be the same. However, it is generally difficult to set the tilt angles in the forward and backward paths to be the same. It is also difficult to prevent a tilt which occurs due to an error.

Japanese Unexamined Patent Application Publication No. 2006-32928 describes that the beam intensity is changed by a polarizer, an ND (Neutral Density) filter (light amount adjustment filter), a power source, or the like in the annealing direction in order to correct a difference occurring in the forward and backward paths caused by oblique incidence. However, as a method of adjusting the beam intensity, it is just abstractly described that "beam intensity is adjusted to be high to an extent that film chipping (a non-single-crystal semiconductor film comes off or evaporates) does not occur, . . . and the adjusted beam is allowed to enter" (paragraph 0033).

It is therefore desirable to provide a method of manufacturing a semiconductor device realizing higher throughput by making a laser beam reciprocate while reliably suppressing the difference between crystallinity in a forward path and that in a backward path, a method of manufacturing a display apparatus, an apparatus of manufacturing a semiconductor device, and a display apparatus realizing suppressed display unevenness and higher display quality by using the methods and the apparatus.

According to an embodiment of the present invention, there is provided a first method of manufacturing a semiconductor device including the steps of: irradiating a structure to be irradiated including a semiconductor film formed over a substrate with a laser beam, thereby modifying the semiconductor film; and forming a semiconductor device on the modified semiconductor film. In the step of modifying the semiconductor film, the laser beam and the substrate are moved relative to each other in a first direction and a second direction which is opposite to the first direction, a change in an optical characteristic between an area irradiated with the laser beam and an area which is not irradiated with the laser beam in the substrate or an optical characteristic of the irradiated area is measured in each of the first and second directions, and irradiation power of the laser beam is modulated so that the difference between a measurement result in the first direction and a measurement result in the second direction lies in a predetermined range.

According to an embodiment of the present invention, there is provided a second method of manufacturing a semiconductor device including the steps of: irradiating a structure to be irradiated including a semiconductor film formed over a substrate with a laser beam, thereby modifying the semiconductor film; and forming a semiconductor device in the modified semiconductor film. In the step of modifying the semiconductor film, the laser beam and the substrate are moved relative to each other in a first direction and a second direction which is opposite to the first direction, a change in an optical characteristic between an area irradiated with the laser beam and an area which is not irradiated with the laser beam in the substrate or an optical characteristic of the irradiated area is measured in each of the first and second directions, and relative speeds of the laser beam and the substrate are modulated so that the difference between a measurement result in the first direction and a measurement result in the second direction lies in a predetermined range.

According to an embodiment of the present invention, there are provided first and second methods of manufacturing a display apparatus including the steps of: forming a semiconductor device on a substrate; and forming a display element on the substrate on which the semiconductor device is formed. The step of forming the semiconductor device is performed by the first and second methods of manufacturing the semiconductor device of the embodiment of the present invention.

According to an embodiment of the present invention, there is provided a first apparatus of manufacturing the semiconductor device used for a step of irradiating a structure to be irradiated including a semiconductor film formed over a substrate with a laser beam, thereby modifying the semiconductor film, and including: moving means for moving the laser beam and the substrate relative to each other in a first direction and a second direction which is opposite to the first direction; and modulating means for measuring a change in an optical characteristic between an area irradiated with the laser beam and an area which is not irradiated with the laser beam in the substrate or an optical characteristic of the irradiated area in each of the first and second directions, and modulating irradiation power of the laser beam so that the difference between a measurement result in the first direction and a measurement result in the second direction lies in a predetermined range.

According to an embodiment of the present invention, there is provided a second apparatus of manufacturing the semiconductor device used for a step of irradiating a structure to be irradiated including a semiconductor film formed over a substrate with a laser beam, thereby modifying the semiconductor film, and including: moving means for moving the laser beam and the substrate relative to each other in a first direction and a second direction which is opposite to the first direction; and modulating means for measuring a change in an optical characteristic between an area irradiated with the laser beam and an area which is not irradiated with the laser beam in the substrate or an optical characteristic of the irradiated area in each of the first and second directions, and modulating relative speeds of the laser beam and the substrate so that the difference between a measurement result in the first direction and a measurement result in the second direction lies in a predetermined range.

According to an embodiment of the present invention, there are provided first and second display apparatuses including a semiconductor device and a display element on a substrate. The semiconductor device is formed by the first and second methods of manufacturing the semiconductor device of the embodiment of the present invention.

In the first or second apparatus of manufacturing the semiconductor device of the embodiment of the present invention, the structure to be irradiated including the semiconductor film formed over the substrate is irradiated with a laser beam, thereby modifying the semiconductor film. In the operation, the laser beam and the substrate are moved by the moving means relatively in the first direction and the second direction which is opposite to the first direction, so that the throughput becomes higher. By the modulating means, a change in the optical characteristic between the area irradiated with the laser beam and the area which is not irradiated with the laser beam in the substrate, or the optical characteristic of the irradiated area is measured in each of the first and second directions. The irradiation power of the laser power or the relative speeds of the laser beam and the substrate are modulated so that the difference between a measurement result in the first direction and a measurement result in the second direction lies in a predetermined range. Therefore, the difference between crystallinity in the forward path and crystallinity in the backward path is reliably suppressed in the modified semiconductor film, and the characteristic variation in the semiconductor device formed over the semiconductor film is reduced.

Each of the first and second display apparatuses of the present invention has the semiconductor device formed by the first or second method of manufacturing the semiconductor device. Thus, the characteristic difference between the semiconductor devices is reduced, and display unevenness is suppressed.

In the first method of manufacturing the semiconductor device, the first method of manufacturing the display apparatus, and the first apparatus of manufacturing the semiconductor device of the embodiment of the present invention, the laser beam and the substrate are moved relative to each other in a first direction and a second direction which is opposite to the first direction, a change in an optical characteristic between an area irradiated with the laser beam and an area which is not irradiated with the laser beam in the substrate or an optical characteristic of the irradiated area is measured in each of the first and second directions. Irradiation power of the laser beam is modulated so that the difference between a measurement result in the first direction and a measurement result in the second direction lies in a predetermined range. Further, in the second method of manufacturing the semiconductor device, the second method of manufacturing the display apparatus, and the second apparatus of manufacturing the semiconductor device of the embodiment of the present invention, similarly, the relative speeds of the laser beam and the substrate are modulated. Thus, by making the laser beam reciprocate, while increasing the throughput, the difference in crystallinity in the first and second directions is suppressed with reliability, and the characteristic variations in the semiconductor device is reduced. Therefore, when a display apparatus having a display element driven by, as a drive element, a semiconductor device such as a TFT obtained by the manufacturing method is formed, the display apparatus with suppressed display unevenness and having high display quality is realized. In particular, the display apparatus is suitable as an organic light emitting display whose light emission performance is susceptible to variations in the characteristic of a TFT.

Other and further objects, features and advantages of the invention will appear more fully from the following description.

BRIEF DESCRIPTION OF THE DRAWINGS

FIG. 23A is a front view showing a state where a display apparatus as application example 5 is open, FIG. 23B is a side view of the display apparatus, FIG. 23C is a front view showing a state where the display apparatus is closed, FIG. 23D is a left side view, FIG. 23E is a right side view, FIG. 23F is a top view, and FIG. 23G is a bottom view.

DETAILED DESCRIPTION OF THE PREFERRED EMBODIMENTS

Embodiments of the present invention will be described in detail hereinbelow with reference to the drawings.

First Embodiment

Figure 1:
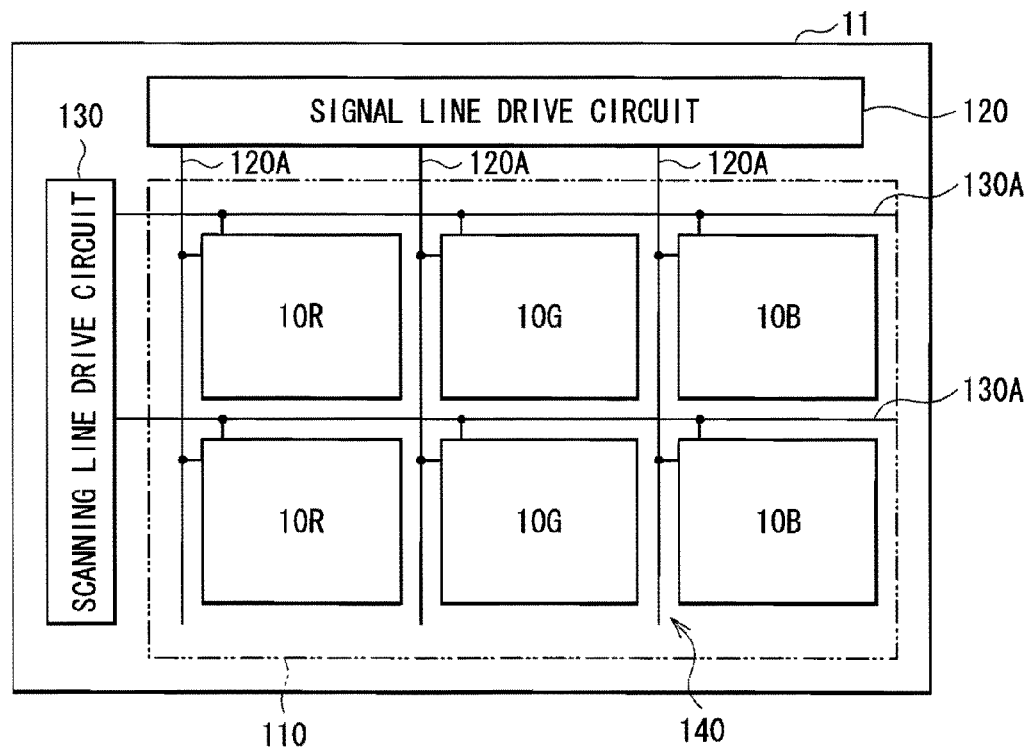
FIG. 1 is a block diagram showing the configuration of a display apparatus as a first embodiment of the present invention.

FIG. 1 shows a configuration of a display apparatus as a first embodiment of the present invention. The display apparatus is used as an ultrathin organic light emitting color display apparatus or the like. For example, a display area 110 in which a plurality of organic light emitting elements 10R, 10G, and 10B which will be described later are disposed in a matrix on a substrate 11 made of glass. Around the display area 110, a signal line drive circuit 120 and a scanning line drive circuit 130 as drivers for displaying a video image are formed.

Figure 2:
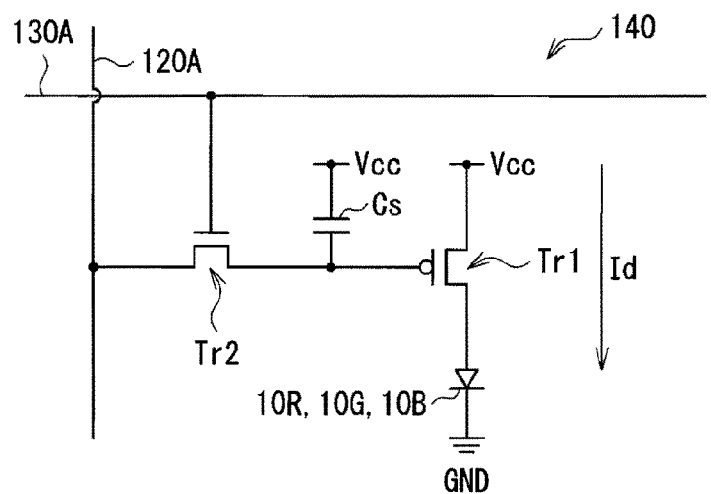
FIG. 2 is a diagram showing an example of a pixel drive circuit illustrated in FIG. 1.

A pixel drive circuit 140 is formed in the display area 110. FIG. 2 shows an example of the pixel drive circuit 140. The pixel drive circuit 140 is an active-type drive circuit formed in a layer under a first electrode 15 which will be described later, and having a drive transistor Tr1 and a write transistor Tr2, a capacitor (holding capacitor) Cs between the transistors Tr1 and Tr2, and the organic light emitting element 10R (10G, or 10B) connected in series to the drive transistor Tr1 between a first power source line (Vcc) and a second power source line (GND). Each of the drive transistor Tr1 and the write transistor Tr2 is a common thin film transistor (TFT). The configuration is not limited and may be, for example, an inverted stagger structure (so-called bottom gate type) or a stagger structure (top gate type).

As will be described later, the drive transistor Tr1 and the write transistor Tr2 modified on a semiconductor film formed over the substrate 11 and included in a structure to be irradiated, which is modified by irradiating the structure with a laser beam. The semiconductor film is modified by moving the laser beam and the substrate 11 relative to each other in a first direction and a second direction which is opposite to the first direction, measuring a change in an optical characteristic between an area irradiated with the laser beam and an area which is not irradiated with the laser beam in the substrate 11, or an optical characteristic of the irradiated area in each of the first and second directions, and modulating the irradiation power of the laser beam so that the difference between a measurement result in the first direction and a measurement result in the second direction lies in a predetermined range.

In the pixel drive circuit 140, a plurality of signal lines 120A are disposed in the column direction, and a plurality of scanning lines 130A are disposed in the row direction. Any one (sub pixel) of the organic light emitting elements 10R, 10G, and 10B corresponds to the cross point of a signal line 120A and a scanning line 130A. The signal lines 120A are connected to the signal line drive circuit 120. An image signal is supplied from the signal line drive circuit 120 to the source electrode of the write transistor Tr2 via the signal line 120A. The scanning lines 130A are connected to the scanning line drive circuit 130. A scan signal is sequentially supplied from the scanning line drive circuit 130 to the gate electrode of the write transistor Tr2 via the scanning line 130A.

Figure 3:
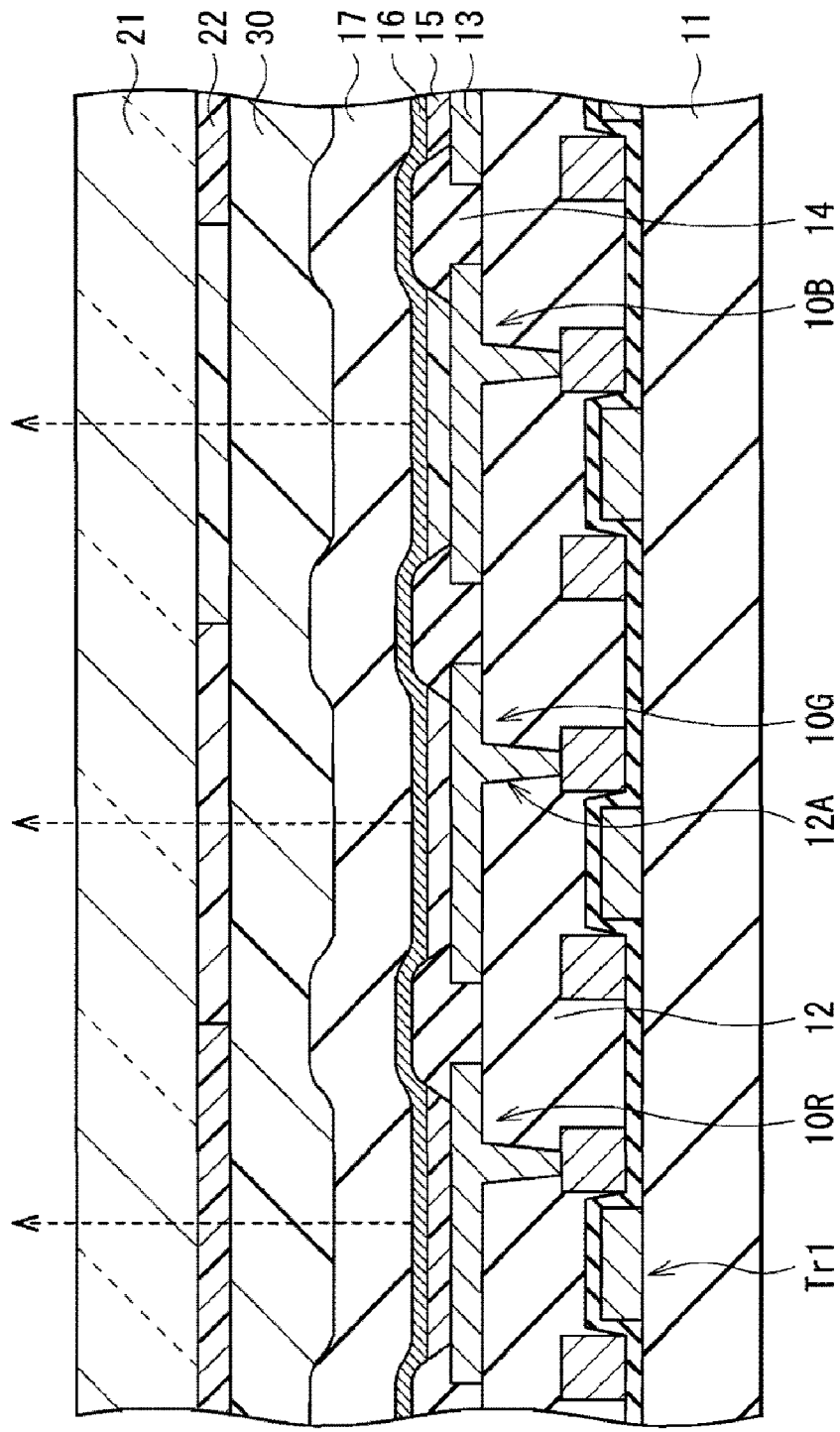
FIG. 3 is a cross section showing the configuration of a display apparatus illustrated in FIG. 1.

FIG. 3 shows a sectional configuration of the display area 110. In the display area 110, the organic light emitting element 10R generating red light, the organic light emitting element 10G generating green light, and the organic light emitting element 10B generating blue light are formed in the order in a matrix as a whole. Each of the organic light emitting elements 10R, 10G, and 10B has a planar strip shape, and a combination of the organic light emitting elements 10R, 10G, and 10B neighboring each other forms a single pixel.

Each of the organic light emitting elements 10R, 10G, and 10B has a configuration in which the drive transistor Tr1 of the pixel drive circuit 140, a planarization insulating film 12, a first electrode 13 as an anode, an interelectrode insulating film 14, an organic layer 15 including a light emitting layer which will be described later, and a second electrode 16 as a cathode are stacked in order from the substrate 11 side.

Such organic light emitting elements 10R, 10G, and 10B are covered with a protection film 17 made of silicon nitride (SiN), silicon oxide (SiO), or the like as necessary. Further, a sealing substrate 21 made of glass or the like is adhered to the entire surface of the protection film 17 with an adhesive layer 30 made of thermosetting resin, ultraviolet curable resin, or the like therebetween. As a result, the organic light emitting elements 10R, 10G, and 10B are sealed. The sealing substrate 21 may be provided with a color filter 22 and a light shield film (not shown) as a black matrix as necessary.

The drive transistor Tr1 is electrically connected to the first electrode 13 via a connection hole 12A formed in the planarization insulating film 12.

The planarization insulation film 12 is used to planarize the surface of the substrate 11 on which the pixel drive circuit 140 is formed. Preferably, the planarization insulation film 12 is made of a material having high pattern precision for the reason that the small connection holes 12A are formed. Examples of the materials of the planarization insulation film 12 are organic materials such as polyimide and inorganic materials such as silicon oxide ($SiO_2$).

The first electrode 13 is formed in correspondence with each of the organic light emitting elements 10R, 10G, and 10B. The first electrode 13 has the function of a reflection electrode for reflecting light generated by the light emitting layer. It is desirable to make the first electrode 13 have reflectance as high as possible in order to increase the luminance efficiency. The first electrode 13 has, for example, a thickness of 100 nm to 1,000 nm and is made of a single metal element of silver (Ag), aluminum (Al), chromium (Cr), titanium (Ti), iron (Fe), cobalt (Co), nickel (Ni), molybdenum (Mo), copper (Cu), tantalum (Ta), tungsten (W), platinum (Pt), gold (Au) or the like, or alloy of them.

The interelectrode insulating film 14 is provided to assure insulation between the first electrode 13 and the second electrode 16 and to form the light emitting region accurately in a desired shape. The interelectrode insulating film 14 is made of, for example, an organic material such as polyimide or an inorganic insulating material such as silicon oxide ($SiO_2$). The interelectrode insulating film 14 has apertures in correspondence with light emitting areas in the first electrode 13. The organic layer 15 and the second electrode 16 may be provided continuously not only on the light emitting region but also on the interelectrode insulation film 14. However, light is emitted only in the apertures in the interelectrode insulation film 14.

The organic layer 15 has, for example, a configuration in which a hole injection layer, a hole transport layer, a light emitting layer, and an electron transport layer (which are not shown) are stacked in order from the of the first electrode 13 side. The layers other than the light emitting layer may be provided as necessary. The configuration of the organic layer 15 may vary according to light emission colors of the organic light emitting elements 10R, 10G, and 10B. The hole injection layer is a buffer layer to increase hole injection efficiency and to prevent leakage. The hole transfer layer is provided to increase efficiency of transporting holes to the light emitting layer. By applying electric field to the light emitting layer, recombination of electrons and holes occurs, and light is generated. The electron transport layer is provided to increase efficiency of transporting electrons to the light emitting layer. The material of the organic layer 15 may be a common low-molecular or high-polymer organic material and is not particularly limited.

The thickness of the second electrode 16 lies, for example, in a range of 5 nm to 50 nm and is made of a single metal element such as aluminum (Al), magnesium (Mg), calcium (Ca), or sodium (Na) or its alloy. In particular, an alloy of magnesium and silver (MgAg alloy), or an alloy of aluminum (Al) and lithium (Li) (AlLi alloy) are preferable. The second electrode 16 may be made of ITO (Indium Tin Oxide) or IZO (Indium Zinc composite Oxide).

The display apparatus may be manufactured, for example, as follows.

FIGS. 4 to 12 are diagrams for explaining a method of manufacturing the display apparatus. The manufacturing method includes, for example, a step of forming the drive transistor Tr1 and the like over the substrate 11 and a step of forming the organic light emitting elements 10R, 10G, and 10B over the substrate 11 on which the drive transistor Tr1 and the like are formed.

Step of Forming Drive Transistor Tr1 and the Like

Figure 4:
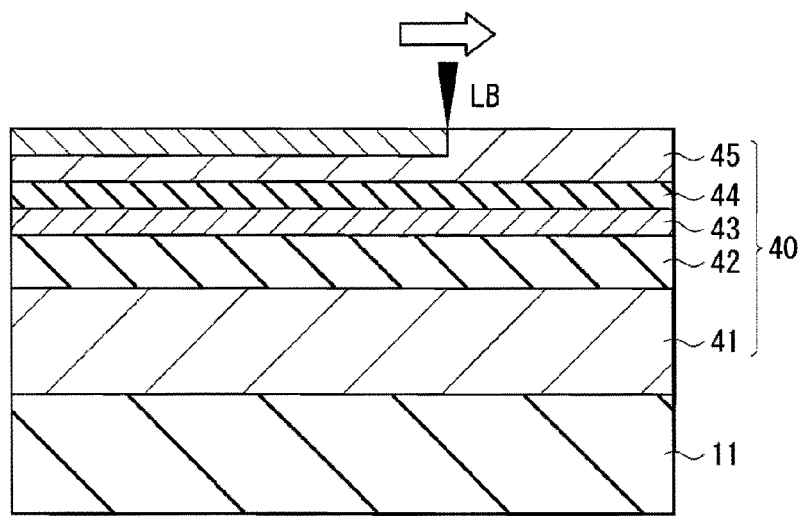
FIG. 4 is a cross section showing an annealing process in a method of manufacturing the display apparatus illustrated in FIG. 3.

First, as shown in FIG. 4, a gate electrode 41 made of molybdenum (Mo) is formed over the substrate 11 made of the above-described material and is shaped in a predetermined shape. After that, a gate insulating film 42 made of silicon oxide and silicon nitride (SiO/SiN), a semiconductor film 43 as a precursor, an interlayer insulating film 44 made of silicon oxide (SiO), and a light absorption layer 45 are stacked in order, thereby forming a structure 40 to be irradiated.

Preferably, the semiconductor film 43 has a thickness of, for example, 50 nm and is made of an amorphous silicon (a-Si).

Preferably, the light absorption layer 45 has a thickness of, for example, 100 nm and is made of a metal, an alloy, an oxide, or a nitride containing at least one selected from the group consisting of chromium (Cr), molybdenum (Mo), tantalum (Ta), titanium (Ti), and tungsten (W).

By irradiating the structure 40 to be irradiated with a laser beam LB from the light absorption layer 45 side, the semiconductor film 43 is modified. The light absorption layer 45 is heated by absorbing the laser beam LB, reaction heat due to oxidation occurs (heat inflow process), and the heat is diffused in the surface of the light absorption layer 45 (heat diffusion to the surface of the light absorption layer 45). Heat treatment of the surface process is also performed, and microcrystal having excellent reproducibility and small variations is formed.

Figure 5:
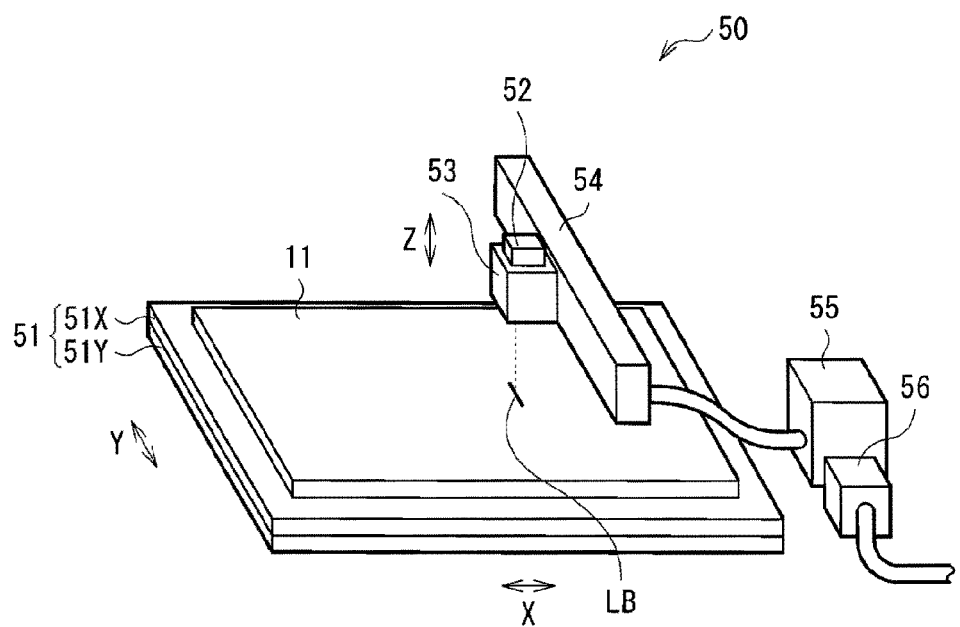
FIG. 5 is a perspective view showing a schematic configuration of a laser annealing apparatus used in the annealing process illustrated in FIG. 4.

FIG. 5 shows an example of a laser annealing apparatus used for modifying the semiconductor film 43. A laser annealing apparatus 50 has a movable stage 51 on which the substrate 11 is mounted. A light source 52 generating the laser beam LB and an irradiation optical system 53 are provided above the movable stage 51. The light source 52 is, preferably, a laser diode since it allows annealing of high stability at low cost. The irradiation optical system 53 is an optical system generating a line beam which is long in the X direction. The light source 52 and the irradiation optical system 53 are attached to a support stage 54 and connected to a controller 55 configured by a computer and a power source 56.

The movable stage 51 is a mount stage for mounting the substrate 11 on which the structure 40 to be irradiated is formed. The main surface of the movable stage 51, on which the substrate 11 is mounted, has high flatness. The substrate 11 may be fixed to the main surface by a not-shown adsorption mechanism. The movable stage 51 has an X stage 51X and a Y stage 51Y. By moving the substrate 11 horizontally in the X direction or the Y direction, the laser beam LB emitted from the light source 52 via the irradiation optical system 53 and the substrate 11 are able to be moved relative to each other.

Figure 6A:
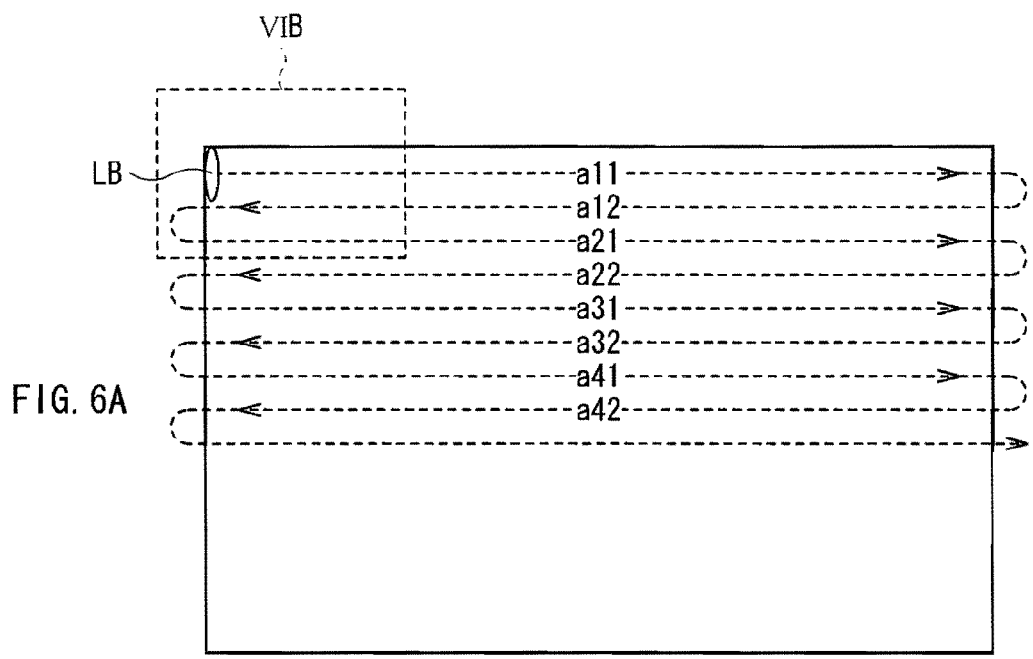
FIGS. 6A and 6B are plan views showing an example of a scan pattern of a laser beam by the laser annealing apparatus illustrated in FIG. 5.
Figure 6B:
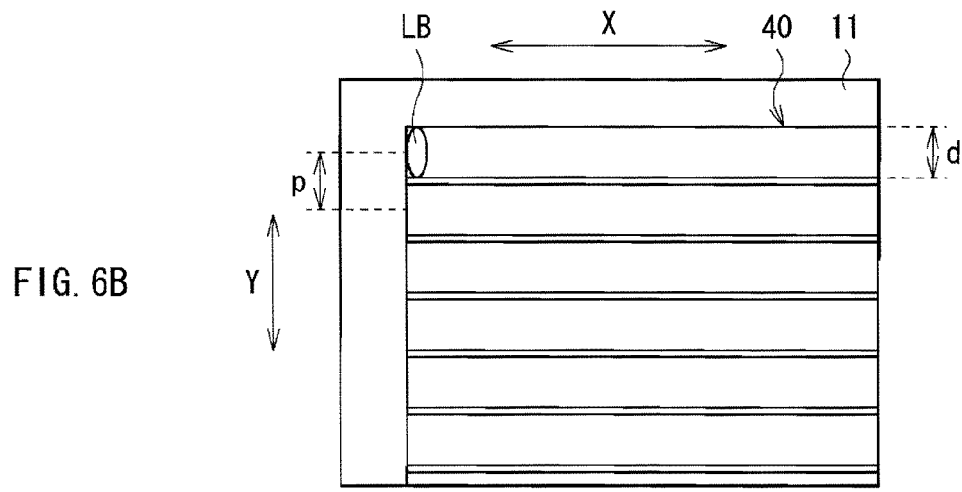

FIGS. 6A and 6B are diagrams for explaining annealing process performed by the laser annealing apparatus 50. The case of performing the annealing process by a set of the light source 52 and the irradiation optical system 53 will be described. The dimension in the longitudinal direction (Y direction) of the laser beam LB is "d", and the shape of a spot of the laser beam LB is an almost ellipse. First, by moving the linear laser beam LB and the substrate 11 relative to each other in the X directions by the movable stage 51, the laser beam LB is swept in a direction all orthogonal to the longitudinal direction of the laser beam LB. A direction a$m1$ (m=1, 2, 3, ...) is defined as a forward path (first direction).

Subsequently, the laser beam LB is shifted in the Y direction only by a pitch "p" and swept in a direction a12 which is opposite to the a11 direction. A direction of a$m2$ (m=1, 2, 3, ...) is defined as a backward path (second direction).

By repeating the sweep in the directions a21, a22, a31, a32, ..., a line scanning is performed with the laser beam LB while relatively moving the laser beam LB and the substrate 11 in the first direction and the second direction which is opposite to the first direction, and the entire surface of a substrate 11 is annealed.

A change in the optical characteristic between the area irradiated with the laser beam LB and the area which is not irradiated with the laser beam LB in the substrate 11 is measured in each of the first and second directions. The irradiation power of the laser beam LB is modulated so that the difference between a measurement result in the first direction and a measurement result in the second direction lies in a predetermined range. In such a manner, in the manufacturing method, throughput is increased by making the laser beam LB reciprocate, and the difference in crystallinity in the forward path and the backward path is reliably suppressed.

Figure 7A:
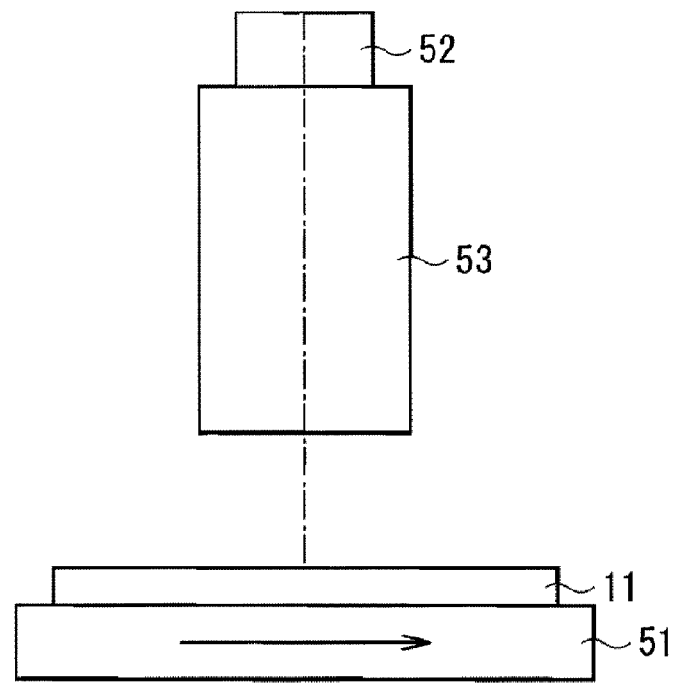
FIGS. 7A and 7B are side views showing the positional relation between an irradiation optical system and the substrate in the annealing process illustrated in FIG. 4.
Figure 7B:
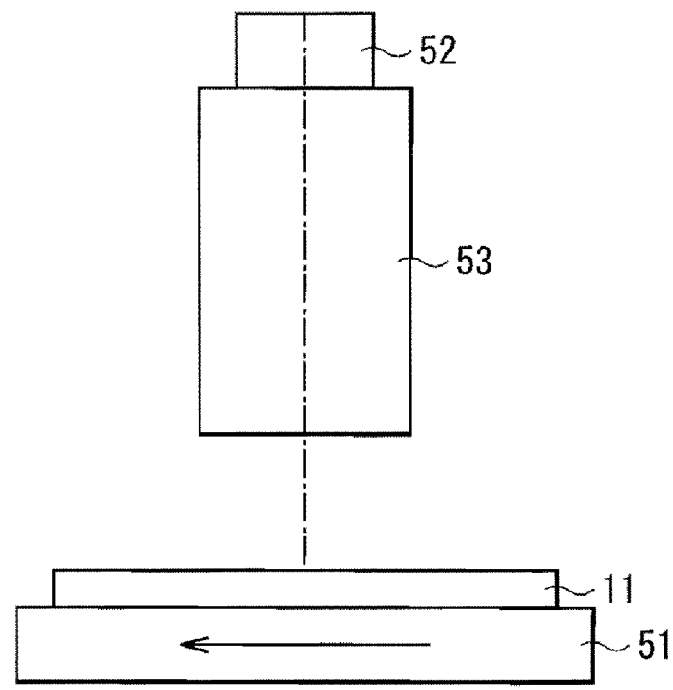
Figure 8A:
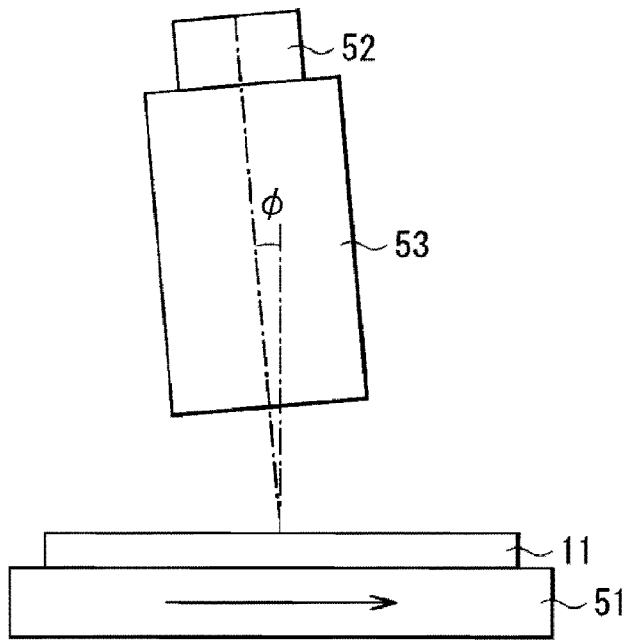
FIGS. 8A and 8B are side views showing another example of the positional relation illustrated in FIGS. 7A and 7B.
Figure 8B:
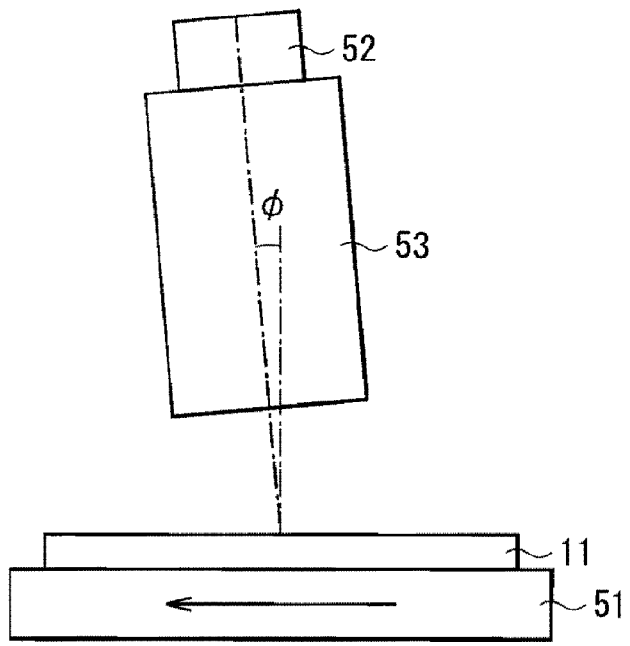

That is, in the case of performing annealing process as shown in FIGS. 6A and 6B, if the irradiation optical system 53 is installed perfectly perpendicular to the substrate 11 as shown in FIGS. 7A and 7B, the irradiation parameters in the forward path and the backward path are not different from each other. However, as shown in FIGS. 8A and 8B, in the case where the irradiation optical system 53 tilts with respect to the substrate 11 only by an angle φ, the irradiation parameters in the forward path and those in the backward path are different from each other. The tilt φ of the irradiation optical system 53 occurs incidentally due to the installation error of the irradiation optical system 53 or is intentionally caused to prevent return light from the structure 40 to be irradiated or to prevent occurrence of interference fringe. It is generally difficult to completely prevent the tilt φ caused by the error. In the case of causing the tilt φ intentionally, a method of adjusting the tilt φ in the forward path and that in the backward path may be employed. However, it is generally difficult to completely adjust the tilts φ to be the same. In any case, the laser beam is not emitted with the same parameters in the forward path and the backward path in the above-described state, and it causes display unevenness.

Generally, when the substrate 11 having the structure 40 to be irradiated which is made of a multilayer film including a precursor is annealed, the optical characteristic in the area irradiated with the laser beam LB and that in the area which is not irradiated with the laser beam LB, for example, intensities of transmission light in the structure 40 to be irradiated are different from each other. Therefore, changes in the intensities of transmission light in the irradiated area and the not-irradiated area which are neighboring each other are measured in each of the first and second directions. The irradiation power of the laser beam LB is modulated so that the difference between a measurement result in the first direction and a measurement result in the second direction lies in a predetermined range. As a result, the difference in crystallinity in the first direction (the forward path) and the second direction (the backward path) is able to be reliably suppressed.

The difference in the intensity of transmission light between the irradiated area and the not-irradiated area (hereinbelow, called "transmission contrast") is expressed as, for example, ((intensity of transmission light of the irradiated area)−(intensity of transmission light of the not-irradiated area))/((intensity of transmission light of the irradiated area)+(intensity of transmission light of the not-irradiated area)).

Figure 9:
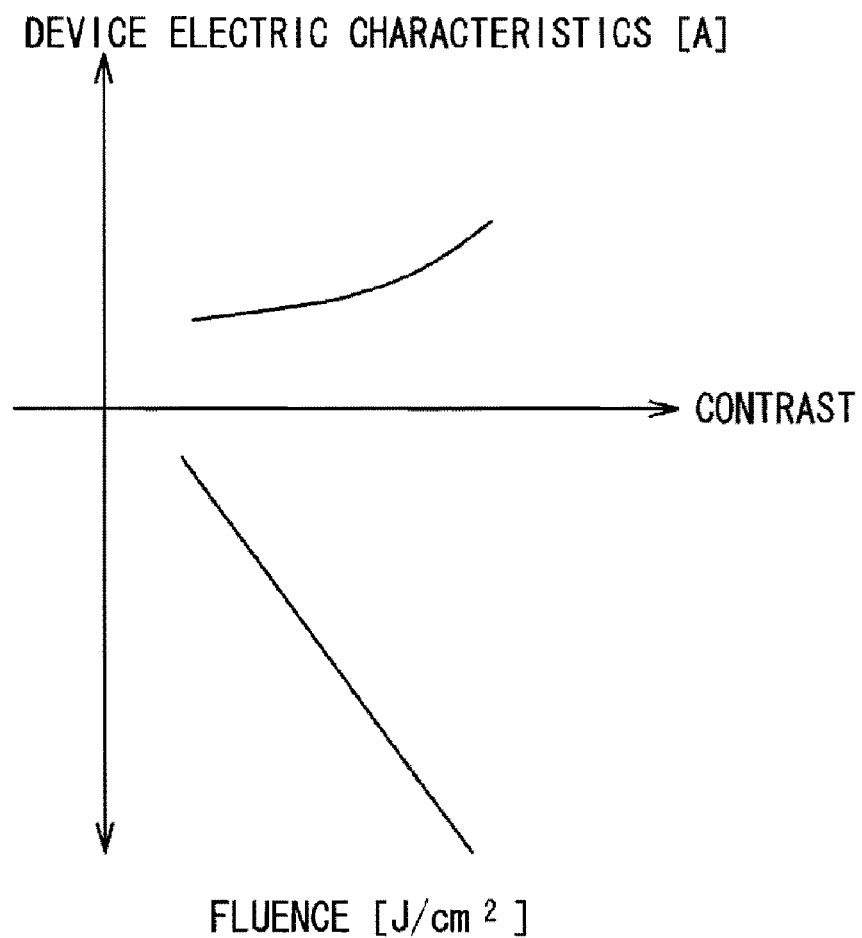
FIG. 9 is a diagram showing the relation between contrast and fluence and the relation between contrast and device electric characteristics.

FIG. 9 shows a result of an experiment on (1) the relation between the transmission contrast and fluence (J/cm$^2$) of irradiation light and (2) the relation between the transmission contrast and the electric characteristic of a TFT device in the case where the characteristic variation in neighboring TFT devices is as small as 3% or less. The fluence denotes energy density (J/cm$^2$) obtained by dividing output energy of the laser beam LB by the irradiation section area.

As understood from FIG. 9, (1) the fluence of the laser beam LB and the transmission contrast have an unconditional linear correspondence relation. (2) The transmission contrast and the electric characteristic of the TFT device are regarded to have an unconditional, almost linear correspondence relation. From (1) and (2), (3) by controlling the irradiation light energy so that the transmission contrast falls in typically a specific value, the electric characteristic of the TFT device also becomes constant.

Generally, it is said that when the luminance difference between neighboring pixels is 3% or less, the difference is not visually recognized. That is, when the current value difference of TFT devices is 3% or less, it is not visually recognized. Consequently, a curve of the correspondence between the transmission contrast and the electric characteristic of the TFT device is generated in advance, its derivative is obtained, and it is sufficient to set the difference between the transmission contrast of the forward path and the transmission contrast of the backward path to be in the range of 0.03/derivative.

Figure 10A:
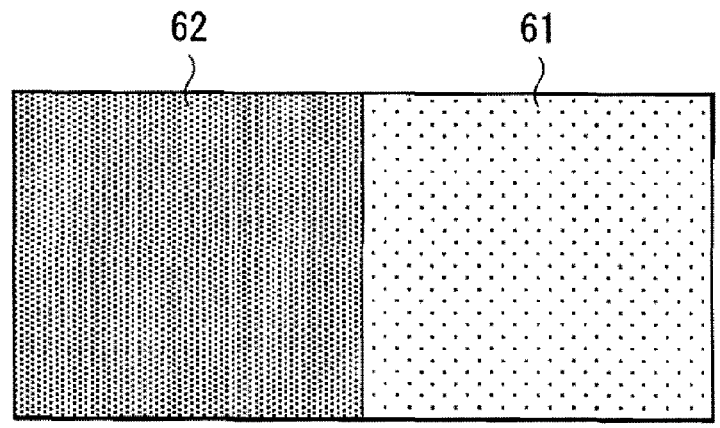
FIGS. 10A and 10B are diagrams showing an example of a transmission contrast measuring apparatus.
Figure 10B:
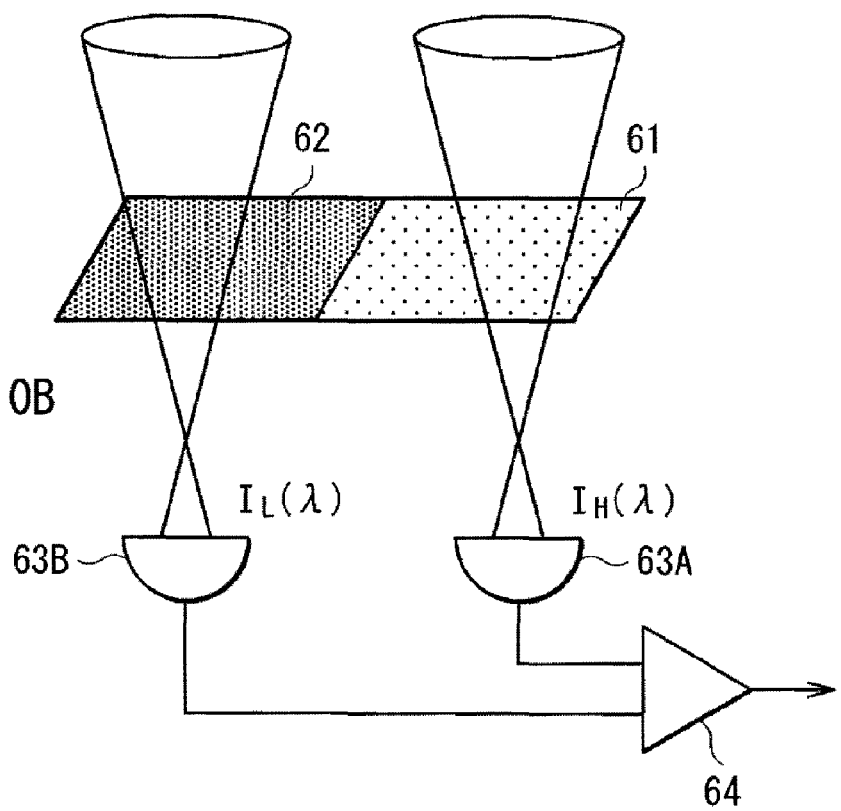

FIGS. 10A and 10B schematically show an apparatus for measuring transmission contrast. For example, a test substrate which is the same as the substrate 11 having the structure 40 to be irradiated is prepared. As described above with reference to FIGS. 6A and 6B, annealing is performed on the test substrate. After that, a laser beam from the same light source is divided into a plurality of laser beams. An irradiated area 61 and a not-irradiated area 62 are irradiated with the laser beams. Transmission light intensity IH(λ) of the irradiated area 61 and transmission light intensity IL(λ) of the not-irradiated area 62 are measured by photodetectors 63A and 63B, and the difference of the results is amplified by a differential amplifier 64. By performing the measurement in each of the first and second directions, a high-precision and high-speed scan is performed, and the measurement evaluation is performed.

In the case where the electric characteristic of the TFT device is able to be predicted to some extent, or do not have to be predicted, it is unnecessary to measure the non-irradiated area 62, that is, it is unnecessary to define the transmission contrast. The difference of the transmission light intensities in the irradiated area 61 in the forward path and the backward path may be set in a predetermined range (for example, 3% or less). In such a manner as well, the electric characteristic of the TFT device in the forward path and that in the backward path may be adjusted.

Figure 11:
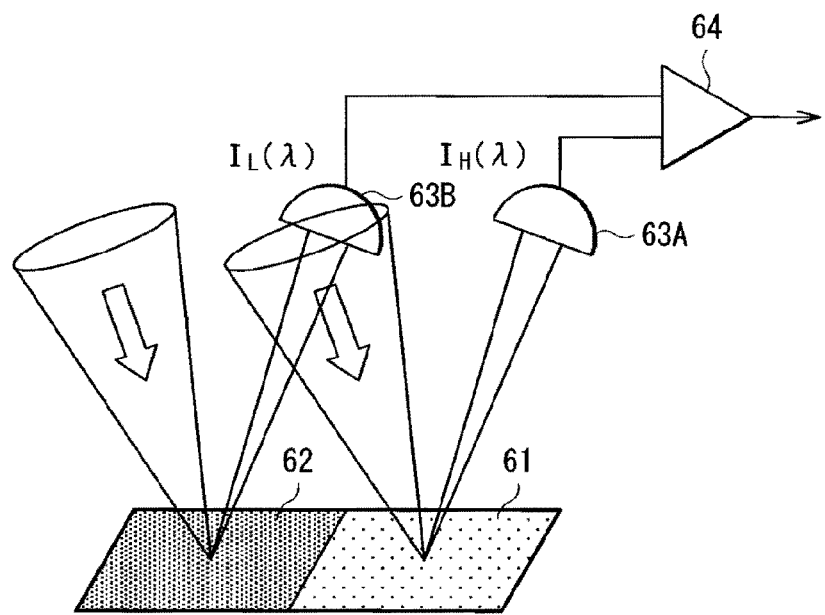
FIG. 11 is a diagram showing an example of a reflection contrast measuring apparatus.

As the optical characteristics of the irradiated area 61 and the not-irradiated area 62, in place of the transmission light intensity, the intensity of reflection light in the structure 40 to be irradiated may be used as shown in FIG. 11. In this case, changes in the reflection light intensities in the irradiated area 61 and the not-irradiated area 62 which are neighboring each other are measured in each of the first and second directions. The irradiation power of the laser beam LB is modulated so that the difference between a measurement result in the first direction and a measurement result in the second direction lies in a predetermined range. A change in the intensity of reflection light between the irradiated area 61 and the not-irradiated area 62 (hereinbelow, called "reflection contrast") is expressed as, for example, ((intensity of reflection light of the irradiated area)−(intensity of reflection light of the not-irradiated area))/((intensity of reflection light of the irradiated area)+(intensity of reflection light of the not-irradiated area)). The reflection contrast may be measured in a manner similar to the measurement of transmission contrast shown in FIGS. 10A and 10B except for measuring the reflection light intensity in place of the transmission light intensity.

Figure 12:
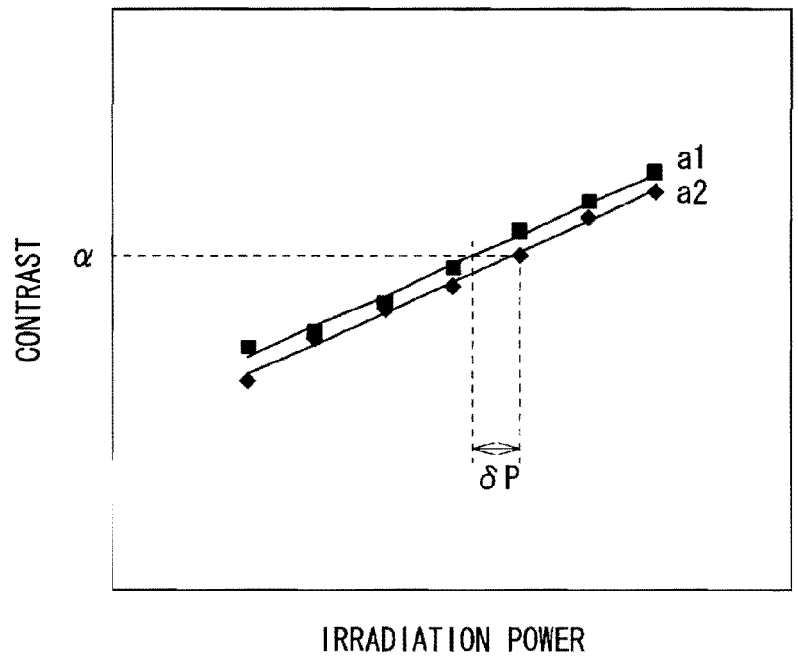
FIG. 12 is a diagram for explaining modulation of laser beam irradiation power.

FIG. 12 expresses the relation between the irradiation power of the laser beam LB in the surface of the substrate 11 and the contrast at a certain stage speed in each of a forward path a1 and a backward path a2. FIG. 12 shows the case where the irradiation optical system 53 tilts with respect to the substrate 11 only by the angle φ, or the case where a sectional profile of the laser beam LB with respect to a plane perpendicular to the travel direction of the laser beam LB in the forward path a1 and that in the backward path a2 are asymmetrical. The stage speed is the same in the forward path a1 and the backward path a2.

As understood from FIG. 12, in the case of modulating the irradiation power of the laser beam LB so that, for example, contrast becomes α, by setting the irradiation power of the backward path a2 to be higher than the irradiation power of the forward path a1 only by δP, the forward path a1 is able to have the same anneal strength with the backward back a2. As a result, the TFT device characteristic in the forward path a1 and that in the backward path a2 become the same, so that display unevenness is able to be suppressed.

As a method of modulating the irradiation power of the laser beam LB, the drive current of the laser diode may be modulated. Alternatively, the irradiation power may be modulated by an ND filter, a wavelength plate, or the like. In the case of modulating the drive current of the laser diode, for example, the drive current of the forward path is set to I1(A) and the drive current of the backward path is set to I2(A) by the computer of the controller 55, and the annealing is performed. The irradiation power may be measured by a power meter installed at the post stage of the irradiation optical system 53, for example, in a place corresponding to the surface position of the structure 40 to be irradiated. In the case where the irradiation optical system 53 has an optical system monitoring a part of the laser beam LB, the irradiation power may be a power monitored by the monitoring optical system.

After determining the irradiation powers of the laser beam LB in the forward path and the backward path, the structure 40 to be irradiated on the substrate 11 is actually annealed under the determined irradiation conditions to modify the semiconductor film 43 from the amorphous silicon (a-Si) to microcrystal or polycrystal silicon (p-Si). After the annealing operation, the light absorption layer 45 is removed. As necessary, the interlayer insulating film 44 may be also removed. However, it is preferable not to remove but to leave the interlayer insulating film 44 since the number of processes does not increase and a stable TFT characteristic is able to be obtained.

Subsequently, the semiconductor film 43 is shaped in a predetermined form. By rear-face exposure from the substrate 11 side, an insulating film (not shown) is formed in a position where it overlaps the gate electrode 41 over the semiconductor film 43. By ion implantation and activation annealing process using the insulating film as a mask, a source and a drain are formed in the semiconductor film 43. In such a manner, the drive transistor Tr1 and the like are formed.

After that, the drive transistor Tr1 and the like are covered with the interlayer insulating film (not shown), and wires and the like are provided, thereby forming the pixel drive circuit 140.

Process of Forming Organic Light Emitting Elements 10R, 10G, and 10B

On the pixel drive circuit 140, for example, by applying, exposing, and developing the above-described material by the spin coat method or the like, the planarization insulating film 12 is formed.

After that, on the planarization insulating film 12, the first electrode 13 made of the above-described material is formed by DC sputtering or the like. For example, by selectively etching the first electrode 13 by the lithography technique or the like, the first electrode 13 is patterned in a predetermined shape. Subsequently, the interlayer insulating film 14 having the above-described thickness and made of the above-described material is formed by, for example, CVD (Chemical Vapor Deposition). By using, for example, the lithography technique, apertures are formed. After that, the organic layer 15 and the second electrode 16 made of the above-described materials are sequentially formed by evaporation or the like, thereby forming the organic light emitting elements 10R, 10G, and 10B. Subsequently, the organic light emitting elements 10R, 10G, and 10B are covered with the protection film 17 made of the above-described material.

After that, an adhesive layer 30 is formed over the protection film 17. A color filter is provided, a sealing substrate 21 made of the above-described material is prepared, and the substrate 11 and the sealing substrate 21 are adhered to each other with the adhesive layer 30 therebetween. As a result, the display apparatus shown in FIG. 3 is completed.

In the display apparatus, when a predetermined voltage is applied across the first electrode 13 and the second electrode 16, current is injected to the light emitting layer in the organic layer 15, holes and electrons are recombined to each other, and light emission occurs. The light transmits the second electrode 16, the protection film 17, and the sealing substrate 21 and is taken out. Since the drive transistor Tr1 and the like formed by the above-described manufacturing method are provided, the characteristic difference of the TFT devices such as the drive transistor Tr1 is reduced, and display unevenness is suppressed.

As described above, in the embodiment, the laser beam LB and the substrate 11 are moved relatively in the first direction and the second direction which is opposite to the first direction, a change in the optical characteristic between the irradiated area 61 and the not-irradiated area 62 in the substrate 11, or the optical characteristic of the irradiated area 61 is measured in each of the first and second directions. The irradiation power of the laser beam LB is modulated so that the difference between the first and second directions of the measurement results lies in a predetermined range. Therefore, by making the laser beam LB reciprocate, while increasing the throughput, the difference in crystallinity between the first direction and second directions is suppressed reliably, and the characteristic difference in the TFT devices such as the drive transistor Tr1 is able to be reduced. Therefore, by forming an organic light emission display apparatus having the organic light emitting elements 10R, 10G, and 10B to be driven with the use of the drive transistor Tr1 and the like as drive elements Tr1 obtained by the manufacturing method, the display apparatus achieving suppressed display unevenness and having high display quality is realized. In particular, the invention is suitable for an organic light emitting apparatus which is easily influenced by the light emission performance according to the characteristic difference of TFTs.

Second Embodiment

Figure 13:
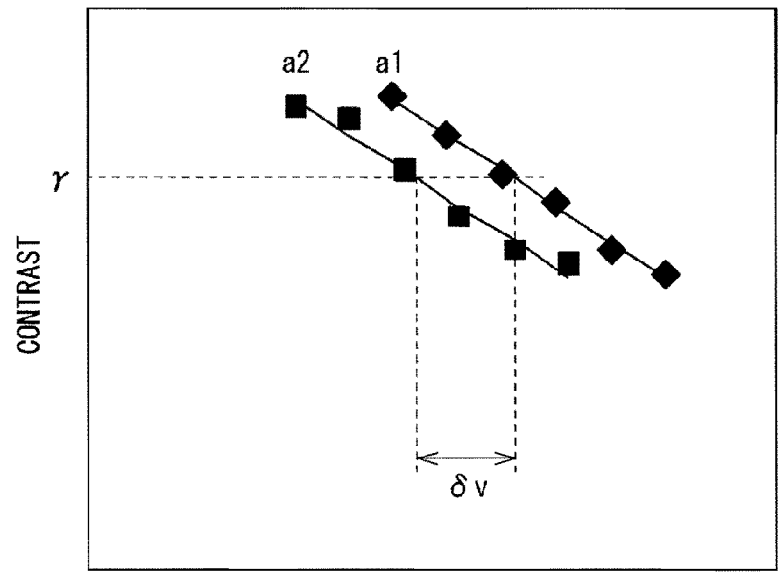
FIG. 13 is a diagram explaining modulation of stage speed in a method of manufacturing a display apparatus of a second embodiment of the present invention.

FIG. 13 is a diagram for explaining a method of manufacturing a display apparatus according to a second embodiment of the invention. In the second embodiment, in place of the irradiation power of the laser beam LB, relative speeds of the laser beam LB and the substrate 11, that is, the speed of the movable stage 51 (stage speed) is modulated. Except for this point, the manufacturing method of the second embodiment is the same as that of the first embodiment. The same operations and effects are obtained. Therefore, the same reference numerals are designated to corresponding elements, and description will be given.

FIG. 13 shows the relation between stage speed and contrast at certain irradiation powers in the forward path a1 and the backward path a2. FIG. 13 shows the case where the irradiation optical system 53 tilts with respect to the substrate 11 only by the angle φ, or the case where the section profile of the laser beam LB with respect to the plane perpendicular to the travel direction of the laser beam LB in the forward path a1 and that in the backward path a2 are asymmetric. The irradiation power in the forward path a1 and that in the backward path a2 are the same.

As understood from FIG. 13, in the case of modulating the stage speed so that the contrast becomes γ, by setting the stage speed in the backward path a2 to be higher than the stage speed in the backward path a1 only by δv, the forward path a1 is able to have the same annealing strength with the backward path a2. As a result, the TFT device characteristics in the forward path a1 and the backward path a2 become the same, and display unevenness is able to be suppressed.

Third Embodiment

Figure 14:
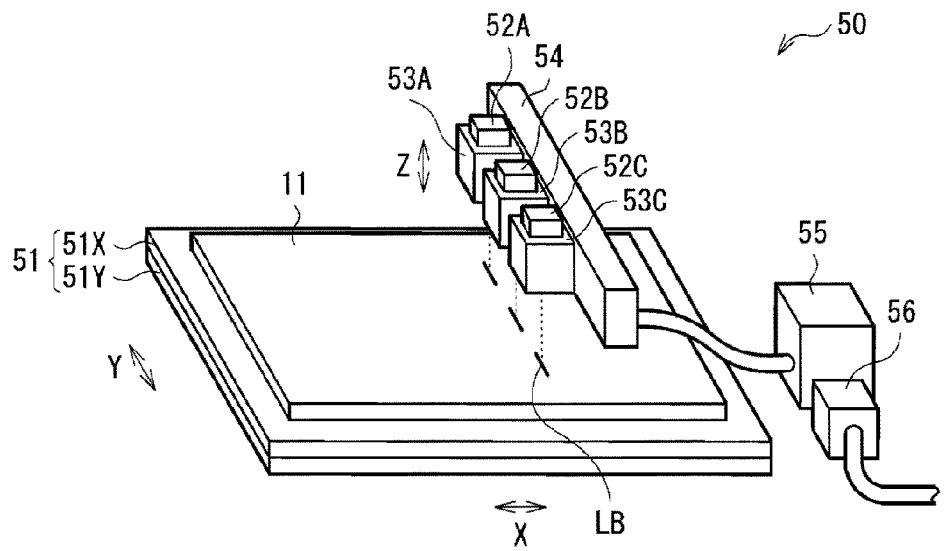
FIG. 14 is a perspective view showing a schematic configuration of a laser annealing apparatus used in a method of manufacturing a display apparatus of a third embodiment of the present invention.

FIG. 14 shows a whole configuration of an annealing apparatus used in a third embodiment of the invention. In the third embodiment, by using the annealing apparatus 50 having three sets of the light source 52 and the irradiation optical system 53 (light sources 52A to 52C and irradiation optical systems 53A to 53C) as shown in FIG. 14, the throughput is further increased. However, in the case of moving the laser beam LB and the substrate 11 relative to each other by the movable stage 51, the stage speed may not be modulated independently in each of the irradiation optical systems 53. Consequently, in the third embodiment, the irradiation power of the laser beam LB is modulated in a manner similar to the first embodiment in each of the irradiation optical systems 53. Except for this point, the manufacturing method of the third embodiment is the same as that of the first embodiment, and the operations and effects are also the same. Therefore, the same reference numerals are designated to the corresponding components, and the description will be given.

Figure 15:
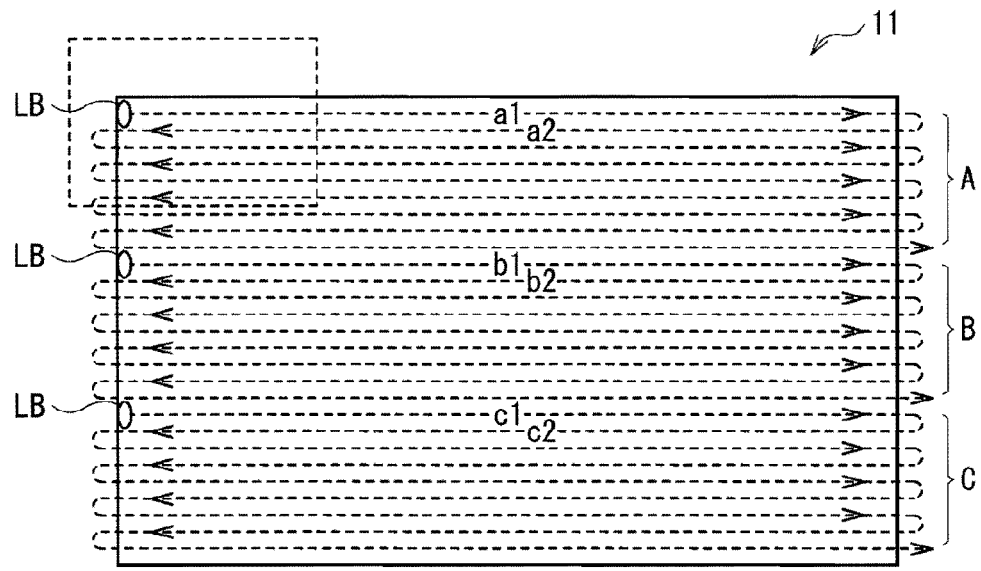
FIG. 15 is a plan view showing an example of a scan pattern of a laser beam of the laser annealing apparatus illustrated in FIG. 14.

FIG. 15 is a diagram for explaining annealing process performed by the annealing apparatus 50 shown in FIG. 14.

The substrate 11 is divided into three regions A, B, and C. The light source 52A and the irradiation optical system 53A perform the annealing process on the region A, the light source 52B and the irradiation optical system 53B perform the annealing process on the region B, and the light source 52C and the irradiation optical system 53C perform the annealing process on the region C in a manner similar to the annealing process described in the first embodiment with reference to FIGS. 6A and 6B.

Figure 16:
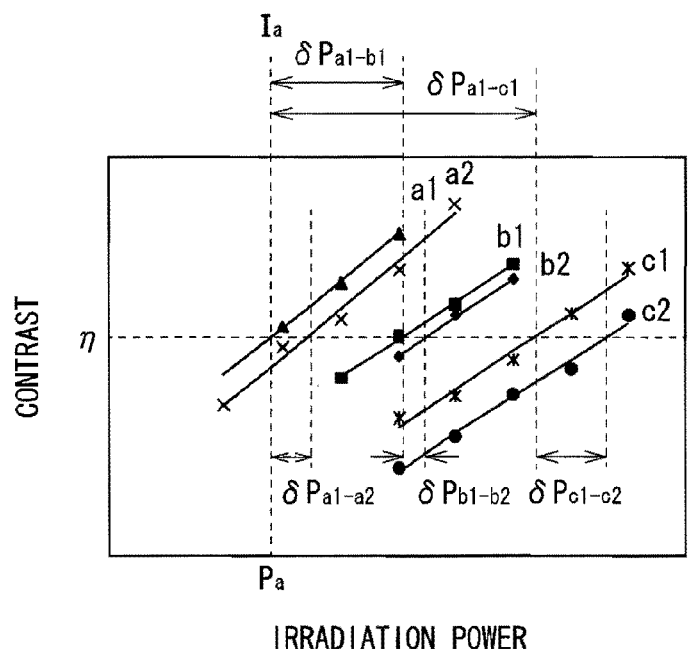
FIG. 16 is a diagram for explaining modulation of irradiation powers of laser beams from irradiation optical systems.

FIG. 16 shows the relation between irradiation powers of the laser beams LB from the irradiation optical systems 53A, 53B, and 53C in the surface of the substrate 11 and contrast at certain stage speed in the forward path a1 and the backward path a2. FIG. 16 shows the case where the irradiation optical systems 53A, 53B, and 53C tilt with respect to the substrate 11 only by the angle φ, or the case where the section profile of the laser beam LB with respect to the plane perpendicular to the travel direction of the laser beam LB in the forward path a1 and that in the backward path a2 are asymmetric. The stage speed in the forward path a1 and that in the backward path a2 are the same.

With reference to FIG. 16, the case of modulating the irradiation power of the laser beam LB so that the contrast becomes η will be described. For example, an irradiation power at which the contrast becomes η in the forward path a1 of the irradiation optical system 53A is set as Ia1. To set the contrast=η in the forward path b1 of the irradiation optical system 53B and the forward path c1 of the irradiation optical system 53B, it is sufficient to set the irradiation powers of the laser beam LB as ((Pa1)+(δPa1−b1)) and (Pa1)+(δPa1−c1). In such a manner, the anneal strengths in the forward paths a1, b1, and c1 of the irradiation optical systems 53A, 53B, and 53C are ale to be made the same.

Next, by modulating the irradiation power in the backward paths a2, b2, and c2 of the irradiation optical systems 53A, 53B, and 53C different from those in the forward paths a1, b1, and c1 only by (δPa1−a2), (δPb1−b2), and (δPc1−c2), respectively, the annealing strength in the forward path a1 and that in the backward path a2 in each of the irradiation optical systems 53A, 53B, and 53C is able to be made the same. As a result, the TFT device characteristics in the forward paths a1, b1, and c1 and those in the backward paths a2, b2, and c2 become the same, and display unevenness is suppressed.

Fourth Embodiment

Figure 17:
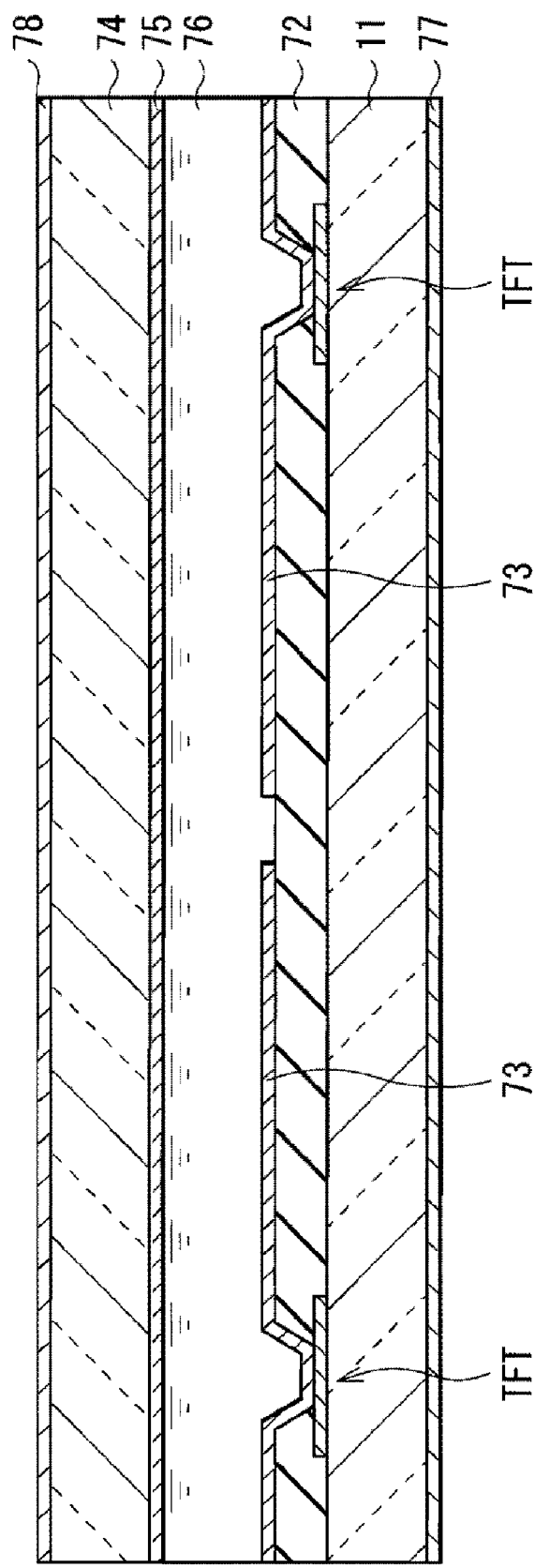
FIG. 17 is a cross section showing the configuration of a display apparatus of a fourth embodiment of the present invention.

FIG. 17 shows an example of a sectional configuration in the case of applying the present invention to a liquid crystal display. The fourth embodiment is the same as the first to third embodiments except that the display element is a liquid crystal display element, and the operations and effects are also the same. Therefore, description will be given by designating the same reference numerals to the corresponding elements.

The configuration of the liquid crystal display element is not limited. For example, as shown in FIG. 17, a TFT according to the manufacturing method of any of the first to third embodiments is formed for each of pixels on the substrate 11. On the TFTs, a planarization insulating film 72 and pixel electrodes 73 made of ITO (Indium Tin Oxide) are formed. A common electrode 75 made of ITO and formed over an opposite substrate 74 made of glass or the like is disposed so as to face the pixel electrodes 73. A liquid crystal layer 76 is provided between the pixel electrodes 73 and the common electrode 75. For each of the substrate 11 and the opposite substrate 74, polarizers 77 and 78 are provided so as to orthogonal to the optical axes (not shown) of the substrates. The substrate 11 is provided with not-shown TFTs, capacitive elements, wires, and the like.

MODULE AND APPLICATION EXAMPLES

Examples of applying the display apparatus described in the foregoing embodiments will be described below. The display apparatus of the embodiment is applicable to any of displays of electronic devices in all of the fields for displaying a video signal supplied from the outside or a video signal generated internally as an image or video image, such as a television apparatus, a digital camera, a notebook-sized personal computer, portable terminals such as a cellular phone, a video camera and the like.

Module

Figure 18:
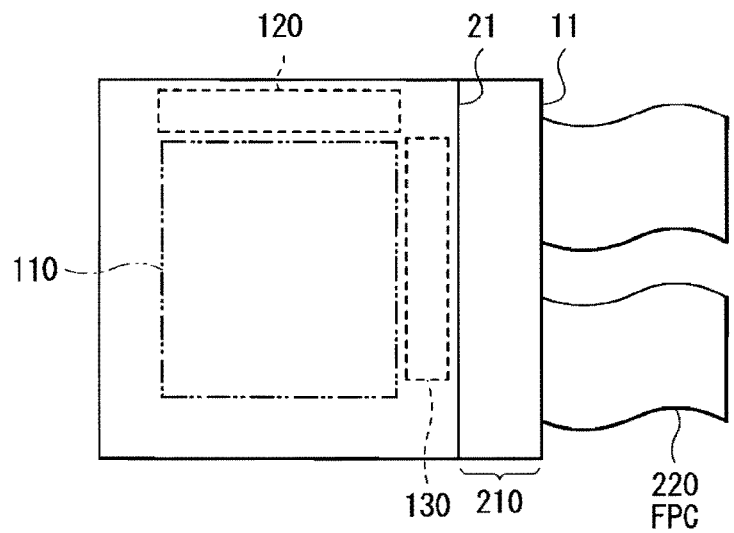
FIG. 18 is a plan view showing a schematic configuration of a module including the display apparatus of the embodiment.

The display apparatus of the foregoing embodiment is included in various electronic devices of application examples 1 to 5 which will be described below, for example, as a module shown in FIG. 18. In the module, for example, an area 210 exposed from the sealing substrate 21 and the adhesive layer 30 is provided at one side of the substrate 11. In the exposed area 210, external connection terminals (not shown) are formed by extending wires of the signal line drive circuit 120 and the scanning line drive circuit 130. The external connection terminal may be provided with a flexible printed circuit (FPC) 220 for inputting/outputting signals.

Application Example 1

Figure 19:
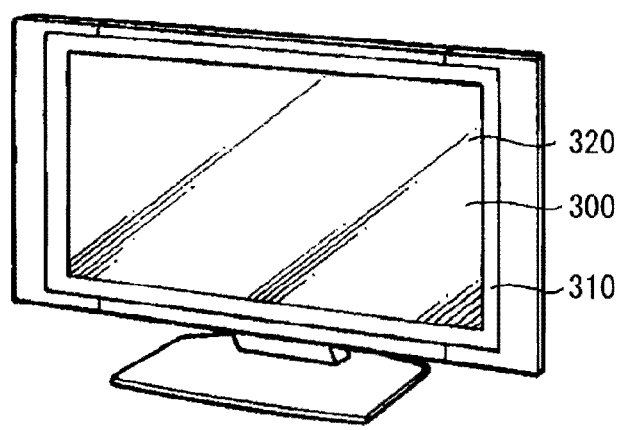
FIG. 19 is a perspective view showing the appearance of application example 1 of the display apparatus of the embodiment.

FIG. 19 shows the appearance of a television apparatus to which the display apparatus of the foregoing embodiment is applied. The television apparatus has, for example, a video display screen 300 including a front panel 310 and a filter glass 320. The video display screen 300 is constructed by the display apparatus of any of the foregoing embodiments.

Application Example 2

Figure 20A:
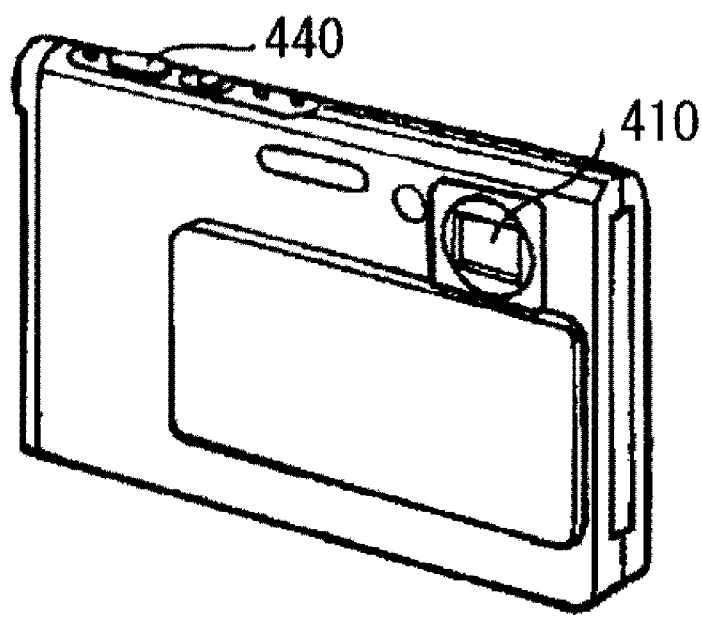
FIG. 20A is a perspective view showing the appearance seen from the surface side of application example 2.
Figure 20B:
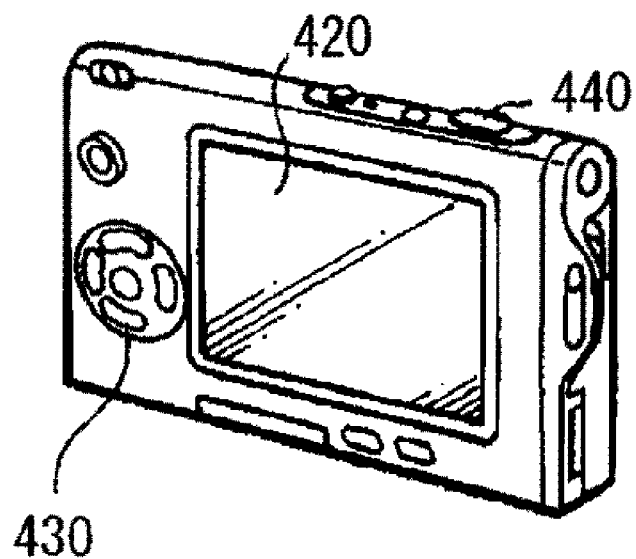
FIG. 20B is a perspective view showing the appearance seen from the back side.

FIGS. 20A and 20B show the appearance of a digital camera to which the display apparatus of the embodiment is applied. The digital camera has, for example, a light emitter 410 for flash light, a display unit 420, a menu switch 430, and a shutter button 440. The display unit 420 is constructed by the display apparatus of any of the foregoing embodiments.

Application Example 3

Figure 21:
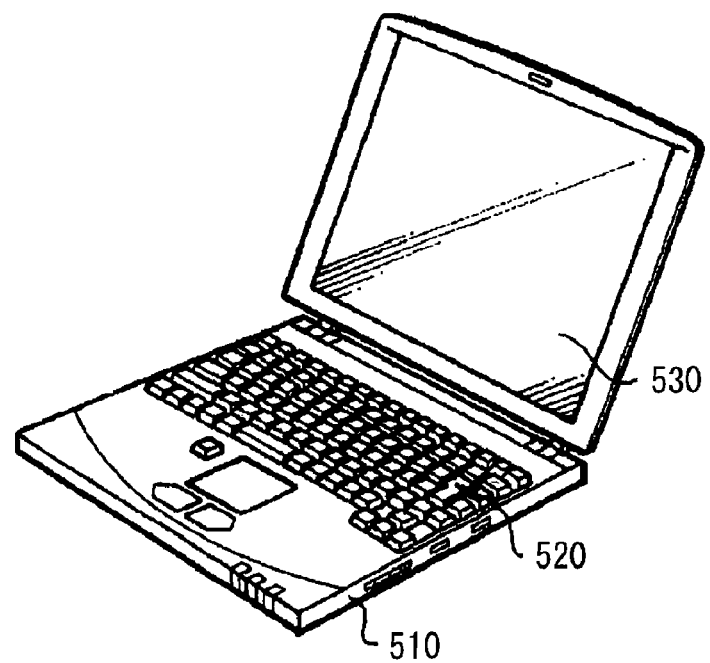
FIG. 21 is a perspective view showing the appearance of application example 3.

FIG. 21 shows the appearance of a notebook-sized personal computer to which the display apparatus of the embodiment is applied. The notebook-sized personal computer has, for example, a body 510, a keyboard 520 for an operation of inputting characters and the like, and a display unit 530 displaying images. The display unit 530 is constructed by the display apparatus of any of the foregoing embodiments.

Application Example 4

Figure 22:
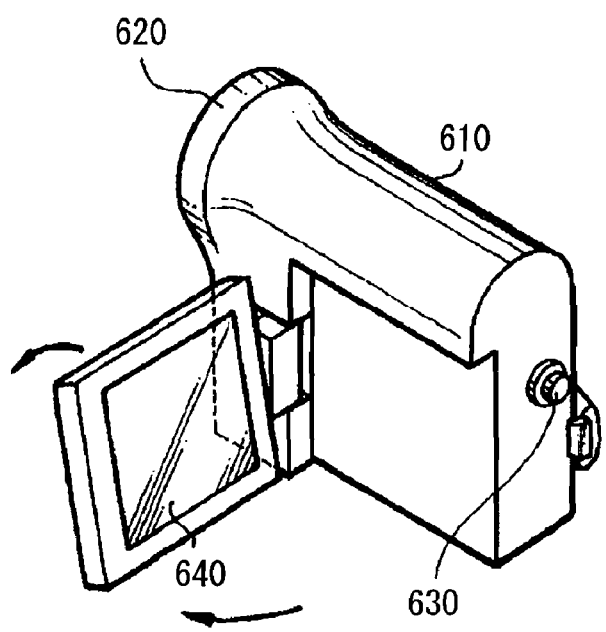
FIG. 22 is a perspective view showing the appearance of application example 4.

FIG. 22 shows the appearance of a video camera to which the display apparatus of the embodiment is applied. The video camera has, for example, a body 610, a lens 620 for capturing a subject, which is provided at a front face of the body 610, an image capture start/stop switch 630, and a display unit 640. The display unit 640 is constructed by the display apparatus of any of the foregoing embodiments.

Application Example 5

FIGS. 23A to 23G show the appearance of a cellular phone to which the display apparatus of the foregoing embodiment is applied. The cellular phone is obtained by coupling an upper casing 710 and a lower casing 720 by a coupling unit (hinge) 730. The cellular phone has a display 740, a sub display 750, a picture light 760, and a camera 770. Each of the display 740 and the sub display 750 is constructed by the display apparatus in any of the foregoing embodiments.

Although the present invention has been described by the embodiments, the invention is not limited to the foregoing embodiments but may be variously modified. The invention is not limited to, for example, the materials and thicknesses of the layers, the film forming methods, the film formation parameters, and the like described above in the embodiments. Other materials, other thicknesses, other film forming methods, and other film formation parameters may be used.

In addition, in the foregoing embodiments, the configuration of the organic light emitting elements 10R, 10B, and 10G has been concretely described. However, it is unnecessary to provide all of the layers, or other layers may be further provided.

In addition, the present invention is applicable not only to the organic light emitting element and the liquid crystal display but also to a display apparatus using another display element such as an inorganic electroluminescent element, an electro-deposition or electrochromic display element.

Obviously many modifications and variations of the present invention are possible in the light of the above teachings. It is therefore to be understood that within the scope of the appended claims the invention may be practiced otherwise than as specifically described.

What is claimed is:

1. A method of manufacturing a semiconductor device, comprising the steps of:
   irradiating a structure to be irradiated including a semiconductor film formed over a substrate with a laser beam, thereby modifying the semiconductor film; and
   forming a semiconductor device on the modified semiconductor film,
   wherein in the step of modifying the semiconductor film, the laser beam and the substrate are moved relative to each other in a first direction and a second direction which is opposite to the first direction, a change in an optical characteristic between an area irradiated with the laser beam and an area which is not irradiated with the laser beam in the substrate or an optical characteristic of the irradiated area is measured in each of the first and second directions, and irradiation power of the laser beam is modulated so that the difference between a measurement result in the first direction and a measurement result in the second direction lies in a predetermined range.

2. A method of manufacturing a semiconductor device, comprising the steps of:
   irradiating a structure to be irradiated including a semiconductor film formed over a substrate with a laser beam, thereby modifying the semiconductor film; and
   forming a semiconductor device in the modified semiconductor film,
   wherein in the step of modifying the semiconductor film, the laser beam and the substrate are moved relative to each other in a first direction and a second direction which is opposite to the first direction, a change in an optical characteristic between an area irradiated with the laser beam and an area which is not irradiated with the laser beam in the substrate or an optical characteristic of the irradiated area is measured in each of the first and second directions, and relative speeds of the laser beam and the substrate are modulated so that the difference between a measurement result in the first direction and a measurement result in the second direction lies in a predetermined range.

3. The method of manufacturing a semiconductor device according to claim 1, wherein intensity of transmission light in the structure to be irradiated is measured as the optical characteristic.

4. The method of manufacturing a semiconductor device according to claim 1, wherein intensity of reflection light in the structure to be irradiated is measured as the optical characteristic.

5. The method of manufacturing a semiconductor device according to claim 1, wherein a change in the optical characteristic between the irradiated area and the not-irradiated area is expressed as ((the optical characteristic of the irradiated area)−(the optical characteristic of the not-irradiated area))/((the optical characteristic of the irradiated area)+(the optical characteristic of the not-irradiated area)).

6. The method of manufacturing a semiconductor device according to claim 1, wherein the structure to be irradiated has the semiconductor film, an interlayer insulating film, and a light absorption layer in order from the substrate side, and applies the laser beam from the light absorption layer side.

7. The method of manufacturing a semiconductor device according to claim 6, wherein the light absorption layer is made of a metal, an alloy, an oxide, or a nitride containing at least one selected from the group consisting of chromium (Cr), molybdenum (Mo), tantalum (Ta), titanium (Ti), and tungsten (W).

8. A method of manufacturing a display apparatus, comprising the steps of forming a semiconductor device over a substrate, and forming a display element over the substrate on which the semiconductor device is formed,
wherein the step of forming the semiconductor device includes the steps of:
irradiating a structure to be irradiated including a semiconductor film formed over a substrate with a laser beam, thereby modifying the semiconductor film; and
forming a semiconductor device over the modified semiconductor film, and
in the step of modifying the semiconductor film, the laser beam and the substrate are moved relative to each other in a first direction and a second direction which is opposite to the first direction, a change in an optical characteristic between an area irradiated with the laser beam and an area which is not irradiated with the laser beam in the substrate or an optical characteristic of the irradiated area is measured in each of the first and second directions, and irradiation power of the laser beam is modulated so that the difference between a measurement result in the first direction and a measurement result in the second direction lies in a predetermined range.

9. A method of manufacturing a display apparatus, comprising the steps of forming a semiconductor device over a substrate, and forming a display element over the substrate over which the semiconductor device is formed,
wherein the step of forming the semiconductor device includes the steps of:
irradiating a structure to be irradiated including a semiconductor film formed over a substrate with a laser beam, thereby modifying the semiconductor film; and
forming a semiconductor device in the modified semiconductor film,
wherein in the step of modifying the semiconductor film, the laser beam and the substrate are moved relative to each other in a first direction and a second direction which is opposite to the first direction, a change in an optical characteristic between an area irradiated with the laser beam and an area which is not irradiated with the laser beam in the substrate or an optical characteristic of the irradiated area is measured in each of the first and second directions, and relative speeds of the laser beam and the substrate are modulated so that the difference between a measurement result in the first direction and a measurement result in the second direction lies in a predetermined range.

* * * * *